(12) United States Patent
Lin

(10) Patent No.: US 7,951,663 B2
(45) Date of Patent: May 31, 2011

(54) SEMICONDUCTOR DEVICE AND METHOD OF FORMING IPD STRUCTURE USING SMOOTH CONDUCTIVE LAYER AND BOTTOM-SIDE CONDUCTIVE LAYER

(75) Inventor: Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/472,170

(22) Filed: May 26, 2009

(65) Prior Publication Data

US 2010/0301450 A1    Dec. 2, 2010

(51) Int. Cl.
    *H01L 21/8244* (2006.01)
(52) U.S. Cl. ........ 438/238; 438/239; 438/210; 438/329; 257/516; 257/532
(58) Field of Classification Search .......... 438/238–239, 438/210, 329, 107; 257/516, 532, 723, E29.343, 257/E21.351
See application file for complete search history.

(56) References Cited

U.S. PATENT DOCUMENTS

| 5,250,843 | A | 10/1993 | Eichelberger |
| 5,353,498 | A | 10/1994 | Fillion et al. |
| 5,689,138 | A | 11/1997 | Dekker et al. |
| 5,841,193 | A | 11/1998 | Eichelberger |
| 6,825,092 | B2 * | 11/2004 | Zurcher et al. ............... 438/384 |
| 7,619,901 | B2 | 11/2009 | Eichelberger et al. |
| 2008/0153245 | A1 | 6/2008 | Lin et al. |
| 2009/0001509 | A1 | 1/2009 | Lin |
| 2009/0309212 | A1 * | 12/2009 | Shim et al. ................. 257/700 |

\* cited by examiner

*Primary Examiner* — Theresa T Doan
(74) *Attorney, Agent, or Firm* — Robert D. Atkins; Patent Law Group

(57) ABSTRACT

A semiconductor device is made by forming a smooth conductive layer over a substrate. A first insulating layer is formed over a first surface of the smooth conductive layer. A first conductive layer is formed over the first insulating layer. A second insulating layer is formed over the first insulating layer and first conductive layer. The substrate is removed. A second conductive layer is formed over a second surface of the smooth conductive layer opposite the first surface of the smooth conductive layer. A third insulating layer is formed over the second conductive layer. The second conductive layer, smooth conductive layer, first insulating layer, and first conductive layer constitute a MIM capacitor. A portion of the second conductive layer includes an inductor. The smooth conductive layer has a smooth surface to reduce particles and hill-locks which decreases ESR, increases Q factor, and increases ESD of the MIM capacitor.

27 Claims, 6 Drawing Sheets

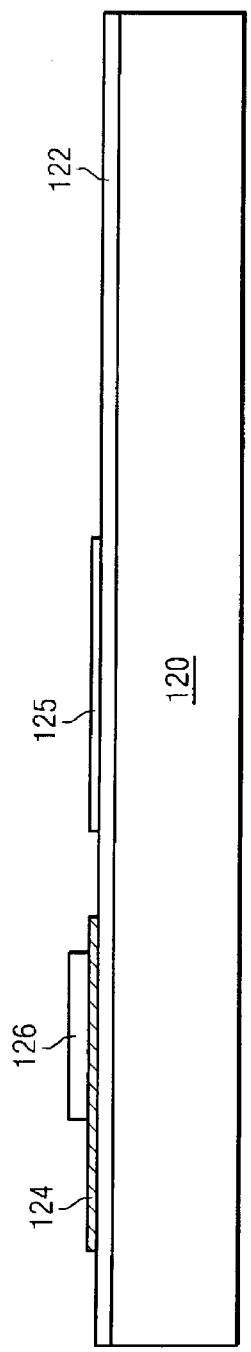
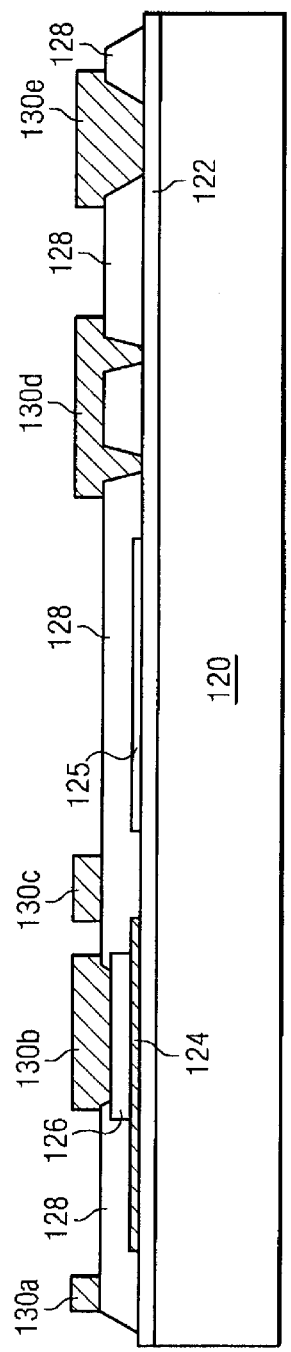
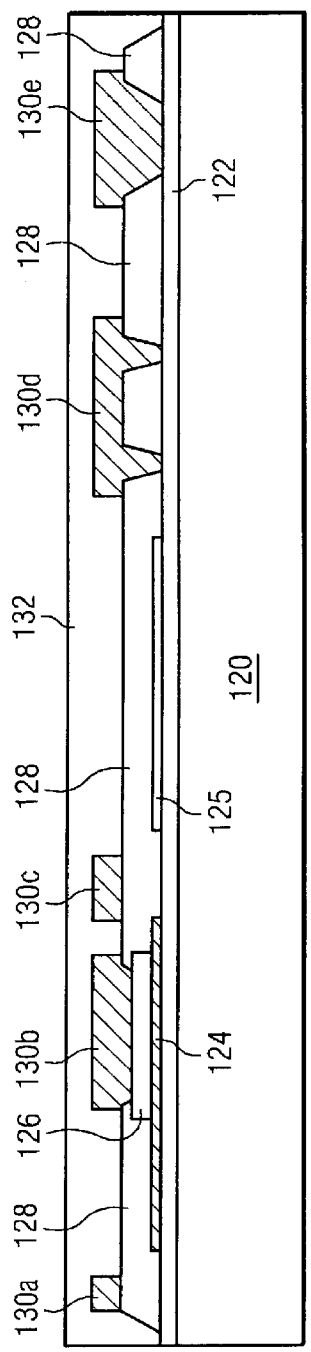
FIG. 3a
FIG. 3b
FIG. 3c

SEMICONDUCTOR DEVICE AND METHOD OF FORMING IPD STRUCTURE USING SMOOTH CONDUCTIVE LAYER AND BOTTOM-SIDE CONDUCTIVE LAYER

FIELD OF THE INVENTION

The present invention relates in general to semiconductor devices and, more particularly, to a semiconductor device and method of forming an IPD structure using a smooth conductive layer and bottom-side conductive layer, and an encapsulation as supporting bulk material.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

The capacitor is typically formed from stacked layers of metal, insulator, and metal (MIM capacitor). The surfaces between the insulator and metal are typically not smooth. The non-smooth surface allows particles and hill-locks to be formed between the dielectric and metal layers. The MIM capacitor must have a high Q factor for optimal RF performance. However, the particles and hill-locks between the dielectric and metal layers increase the effective series resistance (ESR) of the MIM capacitor, which reduces the Q factor. In addition, the electrostatic discharge (ESD) protection level of the MIM capacitor is degraded by the particles and hill-locks between the dielectric and metal layers.

SUMMARY OF THE INVENTION

A need exists for a MIM capacitor and inductor with high Q factors and high level of ESD protection. Accordingly, in one embodiment, the present invention is a method of making a semiconductor device comprising the steps of providing a temporary substrate, forming an interface layer over the temporary substrate, forming a smooth conductive layer over the interface layer, forming a first insulating layer over a first surface of the smooth conductive layer, forming a second insulating layer over the first insulating layer and first surface of the smooth conductive layer, removing a portion of the second insulating layer to expose the first insulating layer and interface layer, forming a first conductive layer over the first insulating layer and interface layer, forming a third insulating layer over the second insulating layer and first conductive layer, removing the temporary substrate to expose the interface layer, removing a portion of the interface layer to expose the smooth conductive layer and first conductive layer, forming a second conductive layer over the first conductive layer and a second surface of the smooth conductive layer opposite the first surface of the smooth conductive layer, and forming a fourth insulating layer over the second conductive layer and interface layer.

In another embodiment, the present invention is a method of making a semiconductor device comprising the steps of forming a smooth conductive layer, forming a first insulating layer over a first surface of the smooth conductive layer, forming a second insulating layer over the first insulating layer and first surface of the smooth conductive layer, removing a portion of the second insulating layer to expose the first insulating layer, forming a first conductive layer over the first insulating layer, forming a third insulating layer over the second insulating layer and first conductive layer, forming a second conductive layer over a second surface of the smooth conductive layer opposite the first surface of the smooth conductive layer, and forming a fourth insulating layer over the second conductive layer.

In another embodiment, the present invention is a method of making a semiconductor device comprising the steps of forming a smooth conductive layer, forming a first insulating layer over a first surface of the smooth conductive layer, forming a first conductive layer over the first insulating layer, forming a second insulating layer over the first insulating layer and first conductive layer, forming a second conductive layer over a second surface of the smooth conductive layer opposite the first surface of the smooth conductive layer, and forming a third insulating layer over the second conductive layer.

In another embodiment, the present invention is a semiconductor device comprising a smooth conductive layer and first insulating layer formed over a first surface of the smooth conductive layer. A first conductive layer is formed over the first insulating layer. A second insulating layer is formed over the first insulating layer and first conductive layer. A second conductive layer is formed over a second surface of the smooth conductive layer opposite the first surface of the smooth conductive layer. A third insulating layer is formed over the second conductive layer.

BRIEF DESCRIPTION OF THE DRAWINGS

FIGS. 3a-3g illustrate a method of forming a MIM capacitor with a smooth conductive layer and bottom-side conductive layer;

DETAILED DESCRIPTION OF THE DRAWINGS

Figure 1:
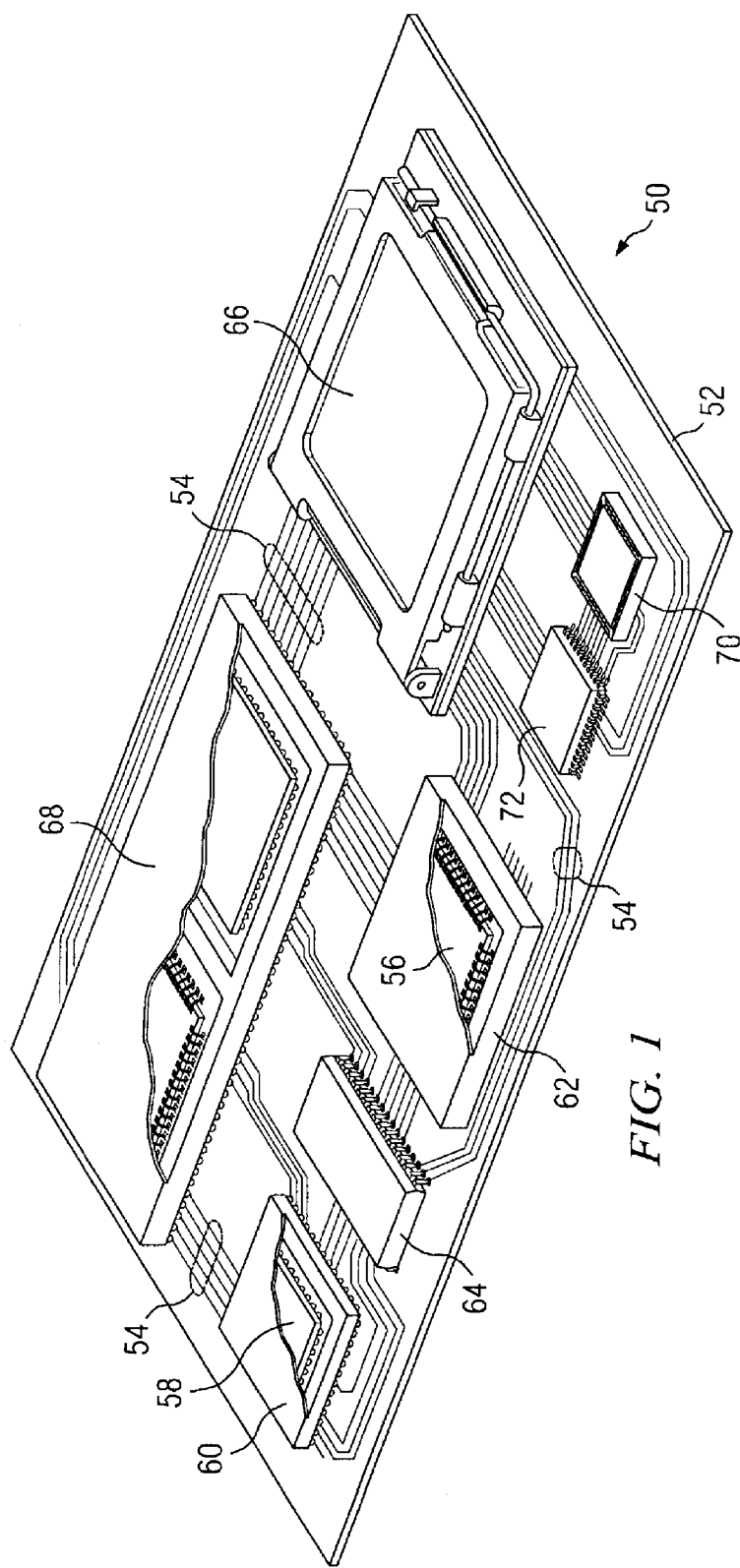
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
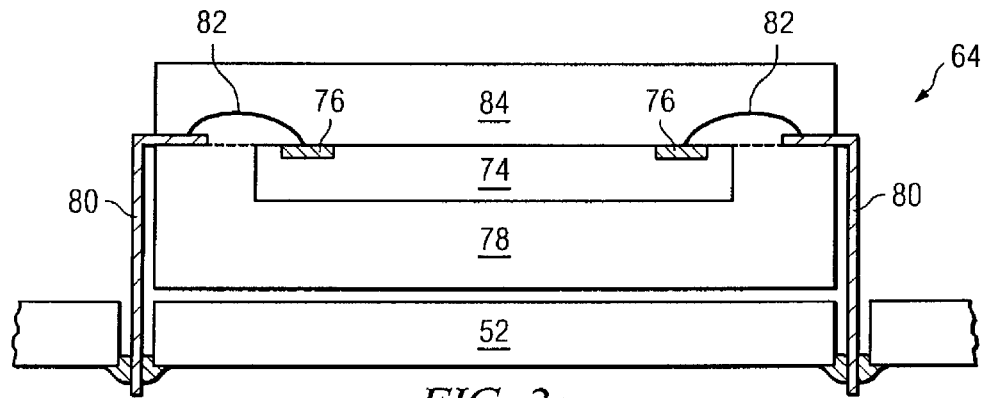
FIGS. 2a-2c illustrate further detail of the representative semiconductor packages mounted to the PCB.
Figure 2B:
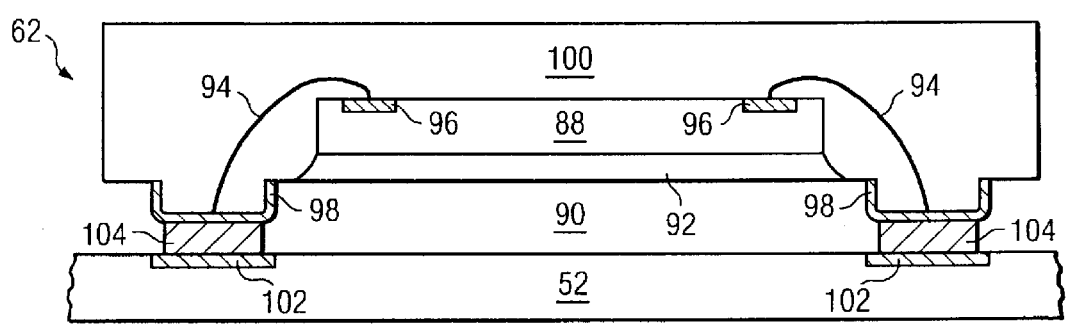
Figure 2C:
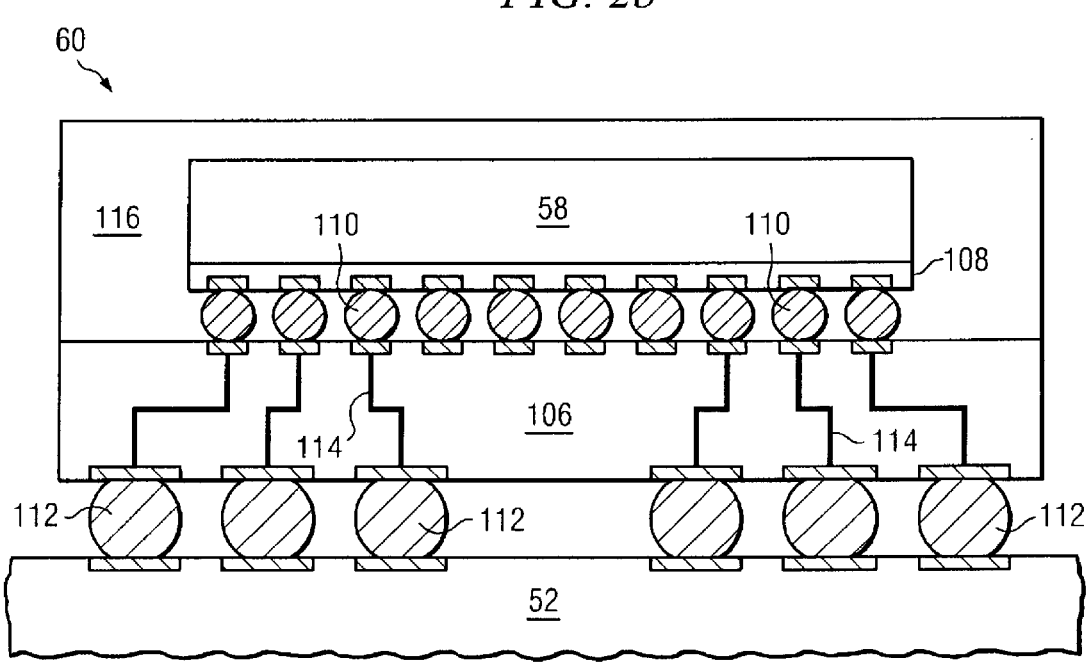

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3D:
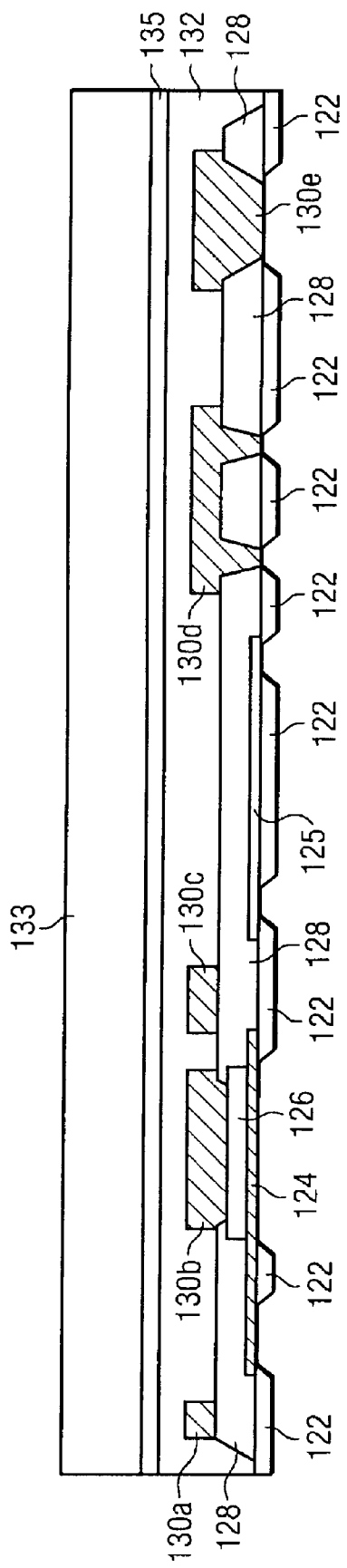

FIGS. 3a-3g illustrate a process of forming an IPD structure using a smooth conductive layer and bottom-side conductive layer. In FIG. 3a, a temporary or sacrificial substrate or carrier 120 contains silicon, polymer, polymer composite, metal, ceramic, glass, glass epoxy, beryllium oxide, tape, or other suitable low-cost, rigid material or bulk semiconductor material for structural support. In one embodiment, carrier 120 in greater than 200 millimeters (mm) in diameter.

An interface layer 122 is applied over carrier 120. The interface layer 122 can be temporary bonding film or etch-stop layer to protect later-formed layers when removing of the temporary carrier. The temporary bonding film can be heat or light releasable material. The etch-stop layer can be silicon dioxide (SiO2), silicon nitride (Si3N4), silicon oxynitride (SiON), organic film, polymer, or metal film with wet etching selectivity. The interface layer 122 is deposited using lamination, PVD, CVD, printing, spin coating, spray coating, sintering, or thermal oxidation.

A smooth conductive layer 124 is formed over interface layer 122 by patterning with PVD, CVD, or other suitable deposition process. In one embodiment, conductive layer 124 is a resistive layer including tantalum silicide (TaxSiy) or other metal silicides, TaN, nickel chromium (NiCr), Ti, TiN, TiW or doped poly-silicon having a resistivity between 5 and 100 ohm/sq. Conductive layer 124 can also be other conductive material exhibiting hill-lock issue during subsequent processing. Conductive layer 124 has opposing first and second smooth surfaces for later formation of a MIM capacitor.

A resistive layer 125 is patterned and deposited over interface layer 122 using PVD, CVD, or other suitable deposition process. Resistive layer 125 is Ta2Si or other metal silicides, TaN, NiCr, Ti, TiN, TiW or doped poly-silicon having a resistivity between 5 and 100 ohm/sq. Conductive layer 124 and resistive layer 125 can be formed during the same deposition and patterning process.

An insulating or dielectric layer 126 is formed over the first smooth surface of conductive layer 124 using patterning with PVD, CVD, printing, sintering, or thermal oxidation. The insulating layer 126 can be one or more layers of Si3N4, SiO2, SiON, tantalum pentoxide (Ta2O5), aluminum oxide (Al2O3), polyimide, benzocyclobutene (BCB), polybenzoxazoles (PBO), low temperature (<250 C) cured photosensitive polymer resist, or other suitable dielectric material. Conductive layer 124 and insulating layer 126 can be patterned with the same mask and by the same or consecutive deposition processes in a high vacuum environment.

In FIG. 3b, an insulating or passivation layer 128 is formed over conductive layer 124, resistive layer 125, and insulating layer 126 using spin coating, PVD, CVD, printing, sintering, or thermal oxidation. The passivation layer 128 can be one or more layers of SiO2, Si3N4, SiON, Ta2O5, Al2O3, polyimide, BCB, PBO, epoxy/ethyl lactate base, or other material having suitable insulating properties. A portion of passivation layer 128 is removed to expose insulating layer 126 and portions of interface layer 122.

An electrically conductive layer 130 is formed over insulating layers 126 and 128 and the exposed portions of interface layer 122 using patterning with PVD, CVD, sputtering, electrolytic plating, electroless plating process, or other suitable metal deposition process to form individual portions or sections 130a-130e. Conductive layer 130 can be one or more layers of Al, Cu, Sn, Ni, Au, Ag, or other suitable electrically conductive material with typically adhesive and barrier layer like Ti, TiW, or Cr. The individual portions of conductive layer 130 can be electrically common or electrically isolated depending on the connectivity of the individual semiconductor die. Conductive layer 130b is the top electrode of the MIM capacitor. Another portion of conductive layer 130 is a bridge for the inductor, ground plane, or interconnections to other circuit components.

In FIG. 3c, an insulating or passivation layer 132 is formed over insulating layer 128 and conductive layer 130 using spin coating, PVD, CVD, printing, sintering, lamination, or molding process. The passivation layer 132 can be one or more layers of low temperature (<250 C) cured photosensitive polymer resist, molding compound, solder mask, liquid crystal film, SiO2, Si3N4, SiON, Ta2O5, Al2O3, polyimide, BCB, PBO, epoxy/ethyl lactate base, or other material having suitable insulating properties. The insulating layer 132 has a low dielectric constant (k) and loss tangent.

In FIG. 3d, an optional temporary carrier 133 is mounted over insulating layer 132 with releasable adhesive layer 135 for structural support. Carrier 133 can be permanent bonded to insulating layer 132 with adhesive layer 135. Carrier 120 is removed by chemical etching, mechanical peel-off, CMP, mechanical grinding, thermal bake, laser scanning, or wet stripping. A portion of interface layer 122 is removed by a patterning and etching process to expose conductive layer 124, resistive layer 125, and conductive layer 130d-130e. Conductive layer 124 acts as the etch stop layer due to its high selectivity to protect insulating layer 126 while removing the portion of interface layer 122. The patterning of interface layer 122 can be completed before the deposition of smooth conductive layer 124 and resistive layer 125.

Figure 3E:
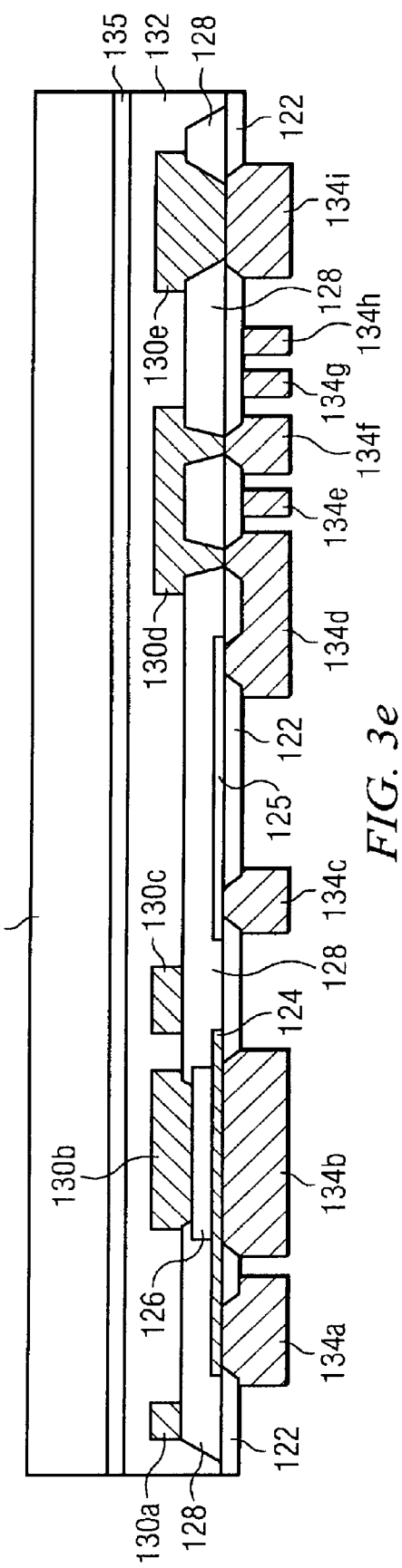

In FIG. 3e, after removing carrier 120, an electrically conductive layer 134 is formed over the bottom-side of the device using PVD, CVD, sputtering, electrolytic plating, electroless plating process, metal foil lamination, or other suitable metal deposition process to form individual portions or sections 134a-134i. Conductive layer 134 can be one or more layers of Ti, TiW, Cr, Al, Cu, Sn, Ni, Au, Ag, or other suitable electrically conductive material. In one embodiment, conductive layer 134 has a thickness typically greater than 3 micrometers (μm). The individual portions of conductive layer 134 can be electrically common or electrically isolated depending on the connectivity of the individual semiconductor die. Conductive layer 134a-134b is electrically connected to the second smooth surface of conductive layer 124, opposite its first smooth surface, to form a bottom electrode of the MIM capacitor. Conductive layer 134c-134d is electrically connected to resistive layer 125. Conductive layer 134d-134f is electrically connected to conductive layer 130d. Conductive layer 134i is electrically connected to conductive layer 130e.

Figure 3F:
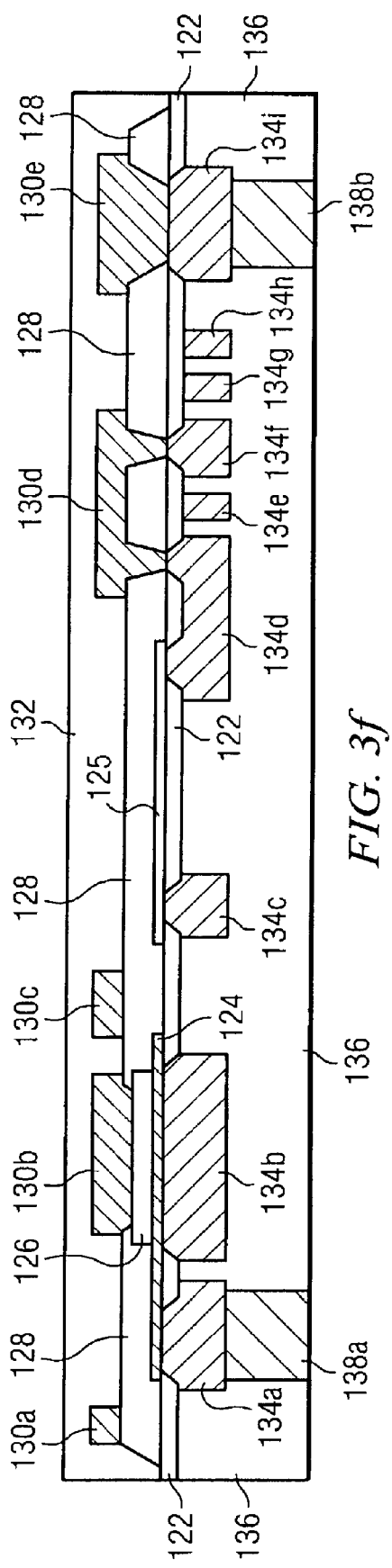

In FIG. 3f, an insulating or encapsulation layer 136 is formed over conductive layer 134 and interface layer 122 using spin coating, PVD, CVD, printing, sintering, compress molding, lamination, or other encapsulation process. The insulating layer 136 can be one or more layers of SiO2, Si3N4, SiON, Ta2O5, Al2O3, molding compound, LCP, low temperature (<250 C) cured photosensitive polymer dielectric, or other material having suitable insulating properties. The insulating layer 136 has high resistivity, low dissipation factor, good thermal conductivity, such as epoxy with proper filler. A portion of insulating layer 136 is removed to expose conductive layer 134a and 134i. An additional layer for wire bonding may be formed over insulating layer 136.

An optional electrically conductive layer 138 is formed over conductive layer 134a and 134i using patterning with PVD, CVD, sputtering, electrolytic plating, electroless plating process, or other suitable metal deposition process to form individual portions or sections 138a and 138b. Conductive layer 138 can be one or more layers of Al, Cu, Sn, Ni, Au, Ag, or other suitable electrically conductive material. Conductive layer 138 is a conductive pillar or stub bump.

In another embodiment, conductive pillars 138 are formed prior to insulating layer 136 by plating or stacking bumps. The insulating layer 136 is then formed around conductive pillars 138. An additional layer for solder bumping or wire bonding may be formed over insulating layer 136.

Figure 3G:
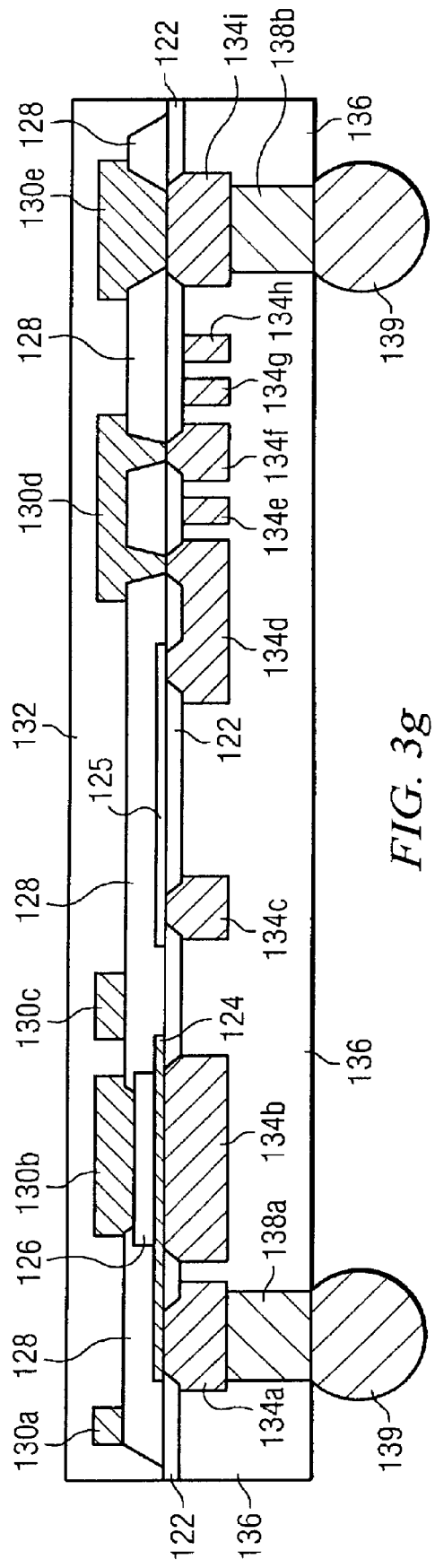

In FIG. 3g, an electrically conductive bump material is deposited over conductive layer 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 138 using a suitable attachment or bonding process. In one embodiment, the bump material is reflowed by heating the material above its melting point to form spherical balls or bumps 139. In some applications, bumps 139 are reflowed a second time to improve electrical contact to conductive layer 138. The bumps can also be compression bonded to conductive layer 138. Bumps 139 represent one type of interconnect structure that can be formed over conductive layer 138. The interconnect structure can also use bond wires, conductive paste, stud bump, micro bump, or other electrical interconnect. In FIG. 3g, either insulation layer 132 or 136 is the main mechanical supporting structure, which can be formed with compress molding process.

Carrier 133 and adhesive layer 135 are removed by non-destructive heat, light, chemical etching, mechanical peel-off, CMP, mechanical grinding, thermal bake, laser scanning, or wet stripping.

The structures described in FIG. 3g constitute a plurality of passive circuit elements or IPDs. In one embodiment, conductive layer 130b, insulating layer 126, conductive layer 124, and conductive layer 134b is a MIM capacitor. Resistive layer 125 is a resistor element in the passive circuit. The individual sections of conductive layer 134e-134h can be wound or coiled in plan-view to produce or exhibit the desired properties of an inductor.

The IPD structure provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions. Conductive layer 130c can be a ground plane for the IPD structure.

Figure 4:
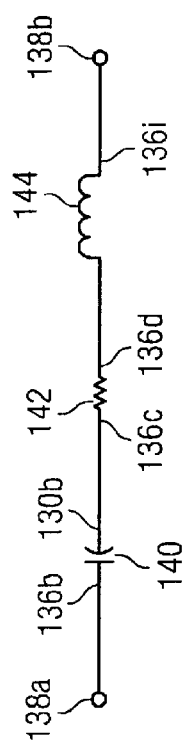
FIG. 4 is a schematic representation of the IPD structure.

FIG. 4 shows a schematic representation of one implementation of the IPDs from FIG. 3g. Capacitor 140 represents the MIM capacitor; resistor 142 represents resistive layer 125; inductor 144 represents conductive layers 134e-134h. Conductive layer 138a is electrically connected to conductive layer 136b; conductive layer 130b is electrically connected to conductive layer 136c; conductive layer 136i is electrically connected to conductive layer 138b.

The MIM capacitor has a given Q factor, which is a measure of efficiency as the ratio of capacitive reactance to resistance at a given frequency. The MIM capacitor must have a high Q factor for optimal RF performance. The insulating layer 126 formed over the first smooth surface of conductive layer 124 reduces the ESR of the MIM capacitor and hotspot problems caused by particles and hill-locks between the dielectric and conductive layers. Conductive layer 124 also reduces high lock issues because of self-annealing. By decreasing ESR, the Q factor of the MIM capacitor is increased. In addition, the thick bottom-side conductive layer formed over the second smooth conductive layer 124 minimizes particles and hill-locks between the conductive layer and resistive layer, which increases the ESD protection level and reduces the ESR and increases Q factor for the MIM capacitor.

Figure 5:
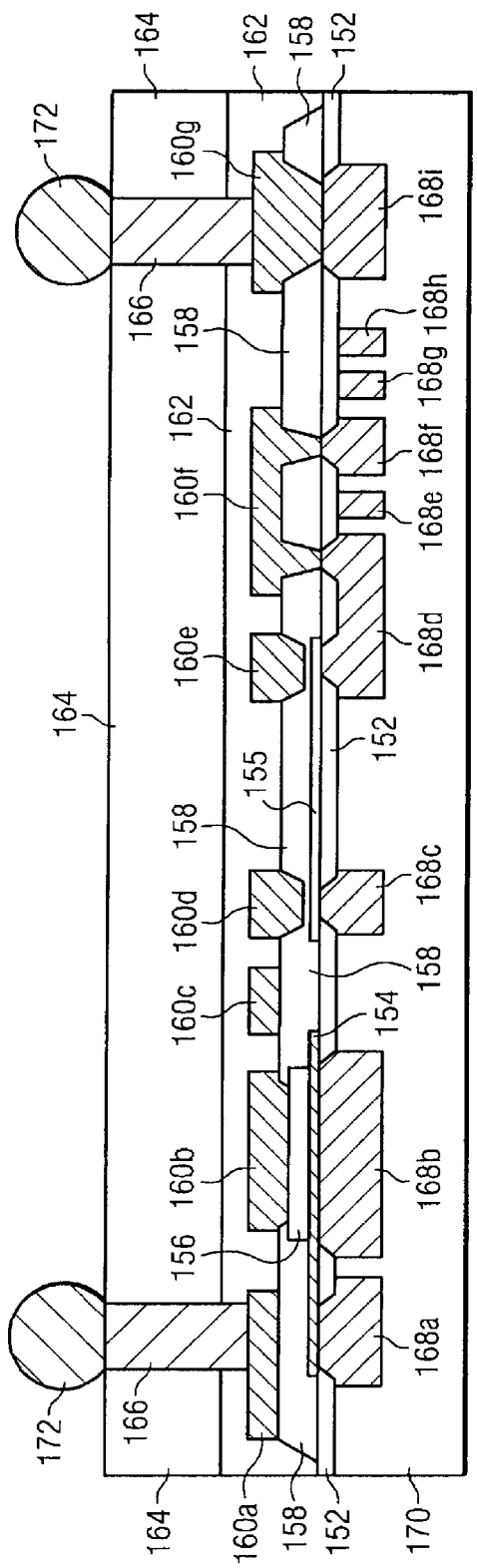
FIG. 5 illustrates another method of forming a MIM capacitor with a smooth conductive layer and bottom-side conductive layer.

FIG. 5 illustrates an alternate process of forming an IPD structure using a smooth conductive layer and bottom-side conductive layer. Similar to FIGS. 3a-3b, a temporary or sacrificial bottom-side substrate or carrier contains silicon, polymer, polymer composite, metal, ceramic, glass, glass epoxy, beryllium oxide, tape, or other suitable low-cost, rigid material or bulk semiconductor material for structural support. An interface layer 152 is applied over the bottom-side carrier. The interface layer 152 can be temporary bonding film or etch-stop layer to protect later-formed layers when removing of the temporary bottom-side carrier. The temporary bonding film can be heat or light releasable material. The etch-stop layer can be SiO2, Si3N4, SiON, organic film, polymer, or metal film with wet etching selectivity. The interface layer 152 is deposited using lamination, PVD, CVD, printing, spin coating, spray coating, sintering, or thermal oxidation.

A smooth conductive layer 154 is formed over interface layer 152 by patterning with PVD, CVD, or other suitable deposition process. In one embodiment, conductive layer 124 is a resistive layer including TaxSiy or other metal silicides, TaN, NiCr, Ti, TiN, TiW or doped poly-silicon having a resistivity between 5 and 100 ohm/sq. Conductive layer 124 can also be other conductive material exhibiting hill-lock issue during subsequent processing. Conductive layer 154 has opposing first and second smooth surfaces for later formation of a MIM capacitor.

A resistive layer 155 is patterned and deposited over interface layer 152 using PVD, CVD, or other suitable deposition process. Resistive layer 155 is Ta2Si or other metal silicides, TaN, NiCr, Ti, TiN, TiW or doped poly-silicon having a resistivity between 5 and 100 ohm/sq. Conductive layer 154 and resistive layer 155 can be formed during the same deposition and patterning process.

An insulating or dielectric layer 156 is formed over the first smooth surface of conductive layer 154 using patterning with PVD, CVD, printing, sintering, or thermal oxidation. The insulating layer 156 can be one or more layers of Si3N4, SiO2, SiON, Ta2O5, Al2O3, polyimide, BCB, PBO, low temperature (<250 C) cured photosensitive polymer resist, or other suitable dielectric material. Conductive layer 154 and insulating layer 156 can be patterned with the same mask and by the same or consecutive deposition processes in a high vacuum environment.

An insulating or passivation layer 158 is formed over conductive layer 154, resistive layer 155, and insulating layer 156 using spin coating, PVD, CVD, printing, sintering, or thermal oxidation. The passivation layer 158 can be one or more layers of SiO2, Si3N4, SiON, Ta2O5, Al2O3, polyimide, BCB, PBO, epoxy/ethyl lactate base, or other material having suitable insulating properties. A portion of passivation layer 158 is removed to expose insulating layer 156 and portions of interface layer 152.

An electrically conductive layer 160 is formed over insulating layers 126 and 128 and the exposed portions of interface layer 122 using patterning with PVD, CVD, sputtering, electrolytic plating, electroless plating process, or other suitable metal deposition process to form individual portions or sections 160a-160g. Conductive layer 160 can be one or more layers of Al, Cu, Sn, Ni, Au, Ag, or other suitable electrically conductive material with typically adhesive and barrier layer like Ti, TiW, or Cr. The individual portions of conductive layer 160 can be electrically common or electrically isolated depending on the connectivity of the individual semiconductor die. Conductive layer 160b is the top electrode of the MIM capacitor. Another portions of conductive layer 160 is a bridge for the inductor, ground plane, or interconnections to other circuit components.

An optional insulating or passivation layer 162 is formed over insulating layer 158 and conductive layer 160 using spin coating, PVD, CVD, printing, sintering, lamination, or molding process. The passivation layer 162 can be one or more layers of low temperature (<250 C) cured photosensitive polymer resist, molding compound, solder mask, liquid crystal polymer film, SiO2, Si3N4, SiON, Ta2O5, Al2O3, polyimide, BCB, PBO, epoxy/ethyl lactate base, or other material having suitable insulating properties. The insulating layer 162 has a low k and loss tangent.

An insulating or passivation layer 164 is formed over insulating layer 162 using spin coating, PVD, CVD, printing, spin coating, sintering, lamination, or molding process. The passivation layer 164 can be one or more layers of low temperature (<250 C) cured photosensitive polymer resist, molding compound, solder mask, liquid crystal polymer film, SiO2, Si3N4, SiON, Ta2O5, Al2O3, polyimide, BCB, PBO, epoxy/ethyl lactate base, or other material having suitable insulating properties. The insulating layer 164 has a low k and loss tangent. A portion of insulating layers 162 and 164 is removed by deep reactive ion etching (DRIE) or laser drilling process to form vias, which expose conductive layer 160a and 160g. The insulating layer 162 and 164 can be formed as a single layer.

Prior to removing the bottom-side carrier, an electrically conductive material is deposited in the vias of insulating layers 162 and 164 by PVD, CVD, sputtering, electrolytic plating, electroless plating process, or other suitable metal deposition process. The conductive material can be one or more layers of Al, Cu, Sn, Ni, Au, Ag, or other suitable electrically conductive material. The conductive material forms conductive pillars 166.

In another embodiment, conductive pillars 166 are formed prior to insulating layers 162 and 164 by plating or stacking bumps. The insulating layer 162 and 164 are then formed around conductive pillars 166.

An optional temporary topside carrier is mounted over insulating layer 164 with a releasable adhesive layer for structural support. The bottom-side carrier is removed by chemical etching, mechanical peel-off, CMP, mechanical grinding, thermal bake, laser scanning, or wet stripping. A portion of interface layer 152 is removed by a patterning and etching process to expose conductive layer 154, resistive layer 155, and conductive layer 160. Conductive layer 164 acts as the etch stop layer due to its high selectivity to protect insulating layer 156 while removing the portion of interface layer 152.

After removing the bottom-side carrier, an electrically conductive layer 168 is formed over the bottom-side of the device using PVD, CVD, sputtering, electrolytic plating, electroless plating process, metal foil lamination, or other suitable metal deposition process to form individual portions or sections 168a-168i. Conductive layer 168 can be one or more layers of Ti, TiW, Cr, Al, Cu, Sn, Ni, Au, Ag, or other suitable electrically conductive material. In one embodiment, conductive layer 168 has a thickness greater than 3 μm. The individual portions of conductive layer 168 can be electrically common or electrically isolated depending on the connectivity of the individual semiconductor die. Conductive layer 168a-168b is electrically connected to the second smooth surface of conductive layer 154, opposite its first smooth surface, to form a bottom electrode of the MIM capacitor. Conductive layer 168c-168d is electrically connected to resistive layer 155. Conductive layer 168i is electrically connected to conductive layer 160g.

An insulating or encapsulation layer 170 is formed over conductive layer 168 and interface layer 152 using spin coating, PVD, CVD, printing, sintering, lamination, or molding process. The passivation layer 170 can be one or more layers of SiO2, Si3N4, SiON, Ta2O5, Al2O3, liquid crystal polymer film, polyimide, BCB, PBO, epoxy/ethyl lactate base, molding compound, low temperature (<250 C) cured photosensitive polymer dielectric, or other material having suitable insulating properties. The passivation layer 170 has high resistivity, low dissipation factor, good thermal conductivity, such as epoxy with proper filler.

The optional topside carrier and adhesive layer are removed by non-destructive heat, light, chemical etching, mechanical peel-off, CMP, mechanical grinding, thermal bake, laser scanning, or wet stripping. An electrically conductive bump material is deposited over conductive pillars 166 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillars 166 using a suitable attachment or bonding process. In one embodiment, the bump material is reflowed by heating the material above its melting point to form spherical balls or bumps 172. In some applications, bumps 172 are reflowed a second time to improve electrical contact to conductive pillars 166. The bumps can also be compression bonded to conductive pillars 166. Bumps 172 represent one type of interconnect structure that can be formed over conductive pillars 166. The interconnect structure can also use bond wires, conductive paste, stud bump, micro bump, or other electrical interconnect.

The structures described in FIG. 5 constitute a plurality of passive circuit elements or IPDs. In one embodiment, conductive layer 160b, insulating layer 156, conductive layer 154, and conductive layer 168b is a MIM capacitor. Resistive layer 155 is a resistor element in the passive circuit. The individual sections of conductive layer 168e-168h can be wound or coiled in plan-view to produce or exhibit the desired properties of an inductor.

The MIM capacitor has a given Q factor, which is a measure of efficiency as the ratio of capacitive reactance to resistance at a given frequency. The MIM capacitor must have a high Q factor for optimal RF performance. The insulating layer 156 formed over the first smooth surface of conductive layer 154 reduces the ESR of the MIM capacitor and hotspot problems caused by particles and hill-locks between the dielectric and conductive layers. Conductive layer 154 also reduces high lock issues because of self-annealing. By decreasing ESR, the Q factor of the MIM capacitor is increased. In addition, the thick bottom-side conductive layer formed over the second smooth conductive layer 154 minimizes particles and hill-locks between the conductive layer and resistive layer, which increases the ESD protection level and reduces the ESR and increases Q factor for the MIM capacitor.

Figure 6:
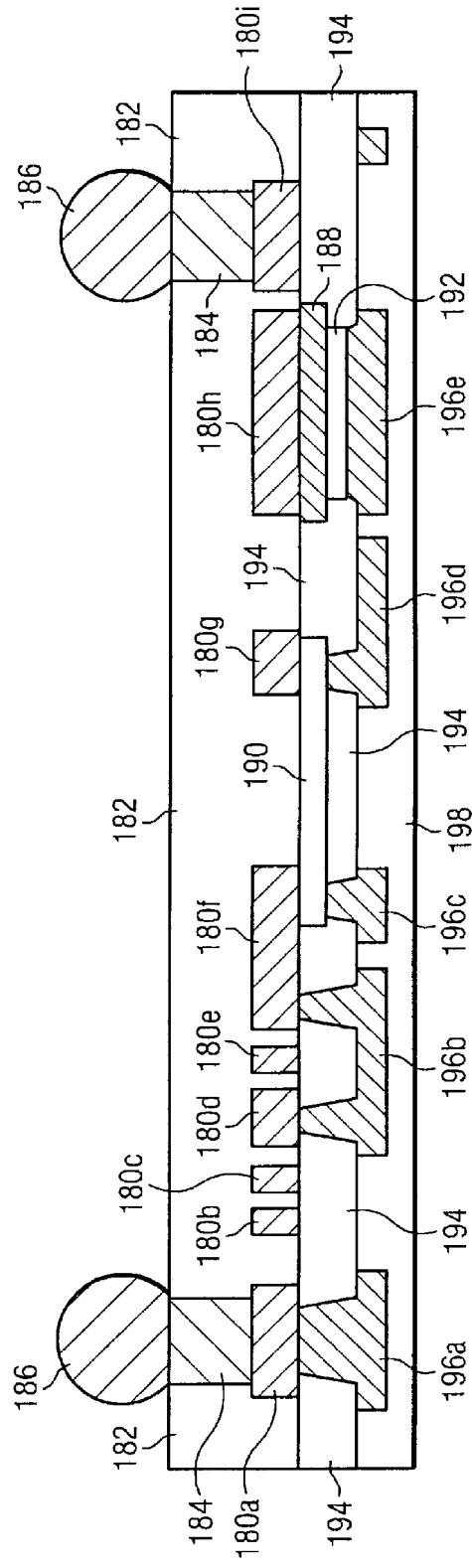
FIG. 6 illustrates another method of forming a MIM capacitor with a smooth conductive layer and bottom-side conductive layer.

FIG. 6 illustrates another process of forming an IPD structure using a smooth conductive layer and bottom-side conductive layer. A temporary or sacrificial bottom-side substrate or carrier contains silicon, polymer, polymer composite, metal, ceramic, glass, glass epoxy, beryllium oxide, tape, or other suitable low-cost, rigid material or bulk semiconductor material for structural support.

An electrically conductive layer 180 is formed over the bottom-side carrier using patterning with PVD, CVD, sputtering, electrolytic plating, electroless plating process, metal foil lamination, or other suitable metal deposition process to form individual portions or sections 180a-180i. Conductive layer 180 can be one or more layers of Ti, TiW, Cr, Al, Cu, Sn, Ni, Au, Ag, or other suitable electrically conductive material. In one embodiment, conductive layer 180 has a thickness greater than 3 μm. The individual portions of conductive layer 180 can be electrically common or electrically isolated depending on the connectivity of the individual semiconductor die.

An insulating or passivation layer 182 is formed over the bottom-side carrier and conductive layer 180 using spin coating, PVD, CVD, printing, sintering, lamination, or molding process. The passivation layer 182 can be one or more layers of low temperature (<250 C) cured photosensitive polymer resist, molding compound, solder mask, liquid crystal polymer film, SiO2, Si3N4, SiON, Ta2O5, Al2O3, polyimide, BCB, PBO, epoxy/ethyl lactate base, or other material having suitable insulating properties. The insulating layer 182 has a low k and loss tangent. A portion of insulating layer 182 is removed by DRIE or laser drilling process to form vias which expose conductive layer 180a and 180i.

Prior to removing the bottom-side carrier, an electrically conductive material is deposited in the vias of insulating layer 182 by PVD, CVD, sputtering, electrolytic plating, electroless plating process, or other suitable metal deposition process. The conductive material can be one or more layers of Al, Cu, Sn, Ni, Au, Ag, or other suitable electrically conductive material. The conductive material forms conductive pillars 184.

In another embodiment, conductive pillars are formed prior to insulating layer 182 by plating or stacking bumps. The insulating layer 182 is then formed around conductive pillars 184.

An electrically conductive bump material is deposited over conductive pillars 184, after forming insulating layer 182 or after forming of insulating layer 198, using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillars 184 using a suitable attachment or bonding process. In one embodiment, the bump material is reflowed by heating the material above its melting point to form spherical balls or bumps 186. In some applications, bumps 186 are reflowed a second time to improve electrical contact to conductive pillars 184. The bumps can also be compression bonded to conductive pillars 184. Bumps 186 represent one type of interconnect structure that can be formed over conductive pillars 184. The interconnect structure can also use bond wires, conductive paste, stud bump, micro bump, or other electrical interconnect.

The bottom-side carrier is removed by chemical etching, mechanical peel-off, CMP, mechanical grinding, thermal bake, laser scanning, or wet stripping. A conductive layer 188 is formed over conductive layer 180h by patterning with PVD, CVD, or other suitable deposition process. In one embodiment, conductive layer 188 is a resistive layer including TaxSiy or other metal silicides, TaN, NiCr, Ti, TiN, TiW or doped poly-silicon having a resistivity between 5 and 100 ohm/sq. Conductive layer 188 has opposing first and second smooth surfaces for later formation of a MIM capacitor.

A resistive layer 190 is patterned and deposited over insulating layer 182 using PVD, CVD, or other suitable deposition process. Resistive layer 190 is Ta2Si or other metal silicides, TaN, NiCr, Ti, TiN, TiW or doped poly-silicon having a resistivity between 5 and 100 ohm/sq. Conductive layer 188 and resistive layer 190 can be formed during the same deposition process.

An insulating or dielectric layer 192 is formed over the first smooth surface of conductive layer 188 using patterning with PVD, CVD, printing, sintering, or thermal oxidation. The insulating layer 192 can be one or more layers of Si3N4, SiO2, SiON, Ta2O5, Al2O3, polyimide, BCB, PBO, or other suitable dielectric material. Conductive layer 188 and insulating layer 192 can be patterned with the same mask and by the same or consecutive deposition processes in a high vacuum environment.

An insulating or passivation layer 194 is formed over conductive layer 180, resistive layer 188 and insulating layer 182 using spin coating, PVD, CVD, printing, sintering, or thermal oxidation. The passivation layer 194 can be one or more layers of SiO2, Si3N4, SiON, Ta2O5, Al2O3, polyimide, BCB, PBO, epoxy/ethyl lactate base, or other material having suitable insulating properties. A portion of passivation layer 194 is removed to expose insulating layer 192, resistive layer 190, and conductive layer 180.

An electrically conductive layer 196 is formed over insulating layers 192, resistive layer 190, and conductive layer 180 using patterning with PVD, CVD, sputtering, electrolytic plating, electroless plating process, or other suitable metal deposition process to form individual portions or sections 196a-196e. Conductive layer 196 can be one or more layers of Al, Cu, Sn, Ni, Au, Ag, or other suitable electrically conductive material with typically adhesive and barrier layer like Ti, TiW, or Cr. The individual portions of conductive layer 196 can be electrically common or electrically isolated depending on the connectivity of the individual semiconductor die. Conductive layer 196e is the bottom top electrode of the MIM capacitor. Conductive layer 196c and 196d are electrodes for resistor 190. Other portions of conductive layer 196 is a bridge for the inductor, ground plane, or interconnections to other circuit components.

An insulating or passivation layer 198 is formed over conductive layer 196 and insulating layer 194 using spin coating, PVD, CVD, printing, sintering, lamination, or molding process. The passivation layer 198 can be one or more layers of SiO2, Si3N4, SiON, Ta2O5, Al2O3, liquid crystal polymer film, polyimide, BCB, PBO, epoxy/ethyl lactate base, or other material having suitable insulating properties. The passivation layer 198 has high resistivity, low dissipation factor, good thermal conductivity, such as epoxy with proper filler.

The structures described in FIG. 6 constitute a plurality of passive circuit elements or IPDs. In one embodiment, conductive layer 180h, conductive layer 188, insulating layer 192, and conductive layer 196e is a MIM capacitor. Resistive layer 190 is a resistor element in the passive circuit. The individual sections of conductive layer 180b-180e can be wound or coiled in plan-view to produce or exhibit the desired properties of an inductor.

The MIM capacitor has a given Q factor, which is a measure of efficiency as the ratio of capacitive reactance to resistance at a given frequency. The MIM capacitor must have a high Q factor for optimal RF performance. The insulating layer 192 formed over the first smooth surface of conductive layer 188 reduces the ESR of the MIM capacitor and hotspot problems caused by particles and hill-locks between the dielectric and conductive layers. Conductive layer 188 also reduces high lock issues because of self-annealing. By decreasing ESR, the Q factor of the MIM capacitor is increased. In addition, the thick bottom-side conductive layer formed over the second smooth conductive layer 188 minimizes particles and hill-locks between the conductive layer and resistive layer, which increases the ESD protection level and reduces the ESR and increases Q factor for the MIM capacitor.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a temporary substrate;
   forming an interface layer over the temporary substrate;
   forming a smooth conductive layer over the interface layer;
   forming a first insulating layer over a first surface of the smooth conductive layer;
   forming a second insulating layer over the first insulating layer and first surface of the smooth conductive layer;
   removing a portion of the second insulating layer to expose the first insulating layer and interface layer;
   forming a first conductive layer over the first insulating layer and interface layer;
   forming a third insulating layer over the second insulating layer and first conductive layer;
   removing the temporary substrate to expose the interface layer;
   removing a portion of the interface layer to expose the smooth conductive layer and first conductive layer;
   forming a second conductive layer over the first conductive layer and a second surface of the smooth conductive layer opposite the first surface of the smooth conductive layer; and
   forming a fourth insulating layer over the second conductive layer and interface layer.

2. The method of claim 1, further including:
   removing a portion of the fourth insulating layer to expose the second conductive layer; and
   forming a third conductive layer over the second conductive layer.

3. The method of claim 1, wherein the second conductive layer, smooth conductive layer, first insulating layer, and first conductive layer constitute a metal-insulator-metal (MIM) capacitor.

4. The method of claim 3, wherein the smooth conductive layer reduces particles and hill-locks between the first insulating layer and smooth conductive layer which increases breakdown voltage and electrostatic discharge protection for the MIM capacitor.

5. The method of claim 3, wherein the smooth conductive layer and second conductive layer form a bottom electrode of the MIM capacitor and increase Q factor of the MIM capacitor.

6. The method of claim 1, wherein a portion of the second conductive layer includes an inductor.

7. A method of making a semiconductor device, comprising:
   providing a carrier;
   forming a smooth conductive layer over the carrier;
   forming a first insulating layer over a first surface of the smooth conductive layer;
   forming a second insulating layer over the first insulating layer and first surface of the smooth conductive layer;
   removing a portion of the second insulating layer to expose the first insulating layer;
   forming a first conductive layer over the first insulating layer;
   forming a third insulating layer over the second insulating layer and first conductive layer;
   removing the carrier;
   forming a second conductive layer over a second surface of the smooth conductive layer opposite the first surface of the smooth conductive layer; and
   forming a fourth insulating layer over the second conductive layer.

8. The method of claim 7, further including:
   removing a portion of the fourth insulating layer to expose the second conductive layer; and
   forming a third conductive layer over the second conductive layer.

9. The method of claim 7, wherein the second conductive layer, smooth conductive layer, first insulating layer, and first conductive layer constitute a metal-insulator-metal (MIM) capacitor.

10. The method of claim 9, wherein the smooth conductive layer reduces particles and hill-locks between the first insulating layer and smooth conductive layer which increases breakdown voltage and electrostatic discharge protection for the MIM capacitor.

11. The method of claim 9, wherein the smooth conductive layer and second conductive layer form a bottom electrode of the MIM capacitor and increase Q factor of the MIM capacitor.

12. The method of claim 7, wherein a portion of the second conductive layer includes an inductor.

13. The method of claim 7, further including forming a resistive layer between the substrate and second insulating layer.

14. A method of making a semiconductor device, comprising:
   providing a carrier;
   forming a first conductive layer over the carrier;
   forming a first insulating layer over a first surface of the first conductive layer;
   forming a second insulating layer over the first insulating layer and first surface of the first conductive layer;
   removing a portion of the second insulating layer to expose the first insulating layer;
   forming a second conductive layer over the first insulating layer;
   forming a third insulating layer over the second insulating layer and second conductive layer;
   removing the carrier;
   forming a third conductive layer over a second surface of the first conductive layer opposite the first surface of the first conductive layer; and
   forming a fourth insulating layer over the third conductive layer.

15. The method of claim 14, further including:
   removing a portion of the fourth insulating layer to expose the third conductive layer; and
   forming a fourth conductive layer over the third conductive layer.

16. The method of claim 14, wherein the third conductive layer, first conductive layer, first insulating layer, and second conductive layer constitute a metal-insulator-metal (MIM) capacitor.

17. The method of claim 16, wherein the first conductive layer reduces particles and hill-locks between the first insulating layer and first conductive layer which increases breakdown voltage and electrostatic discharge protection for the MIM capacitor.

18. The method of claim 16, wherein the first conductive layer and third conductive layer form a bottom electrode of the MIM capacitor and increase Q factor of the MIM capacitor.

19. The method of claim 14, wherein a portion of the third conductive layer includes an inductor.

20. The method of claim 14, wherein the third or fourth insulation layer provide structural support.

21. A method of making a semiconductor device, comprising:
   providing a carrier;
   forming a first conductive layer over the carrier;
   forming a first insulating layer over a first surface of the first conductive layer;
   forming a second insulating layer over the first surface of the first conductive layer;
   forming a second conductive layer over the first insulating layer;
   forming a third insulating layer over the second insulating layer and second conductive layer;
   removing the carrier;
   forming a third conductive layer over a second surface of the first conductive layer opposite the first surface of the first conductive layer; and
   forming a fourth insulating layer over the third conductive layer.

22. The method of claim 21, further including:
   removing a portion of the fourth insulating layer to expose the third conductive layer; and
   forming a fourth conductive layer over the third conductive layer.

23. The method of claim 21, wherein the third conductive layer, first conductive layer, first insulating layer, and second conductive layer constitute a metal-insulator-metal (MIM) capacitor.

24. The method of claim 23, wherein the first conductive layer reduces particles and hill-locks between the first insulating layer and first conductive layer which increases breakdown voltage and electrostatic discharge protection for the MIM capacitor.

25. The method of claim 23, wherein the first conductive layer and third conductive layer form a bottom electrode of the MIM capacitor and increase Q factor of the MIM capacitor.

26. The method of claim 21, wherein a portion of the third conductive layer includes an inductor.

27. The method of claim 21, wherein the third or fourth insulation layer provide structural support.

* * * * *